US012813253B2

(12) United States Patent
Lanzillo et al.

(10) Patent No.: US 12,813,253 B2
(45) Date of Patent: Nov. 24, 2026

(54) CUT SHAPES FOR BACKSIDE METALS

(71) Applicant: International Business Machines Corporation, Armonk, NY (US)

(72) Inventors: Nicholas Anthony Lanzillo, Wynantskill, NY (US); Lawrence A. Clevenger, Saratoga Springs, NY (US); Reinaldo Vega, Mahopac, NY (US); Ruilong Xie, Niskayuna, NY (US); Albert M. Chu, Nashua, NH (US); Brent A. Anderson, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 383 days.

(21) Appl. No.: 18/483,913

(22) Filed: Oct. 10, 2023

(65) Prior Publication Data

US 2025/0118661 A1 Apr. 10, 2025

(51) Int. Cl.

*H10W 20/43* (2026.01)
*H10W 20/00* (2026.01)
*H10W 20/42* (2026.01)
*H10W 20/44* (2026.01)

(52) U.S. Cl.

CPC ......... *H10W 20/43* (2026.01); *H10W 20/056* (2026.01); *H10W 20/067* (2026.01); *H10W 20/098* (2026.01); *H10W 20/42* (2026.01); *H10W 20/4403* (2026.01)

(58) Field of Classification Search

None

See application file for complete search history.

(56) References Cited

U.S. PATENT DOCUMENTS

| | | | | |
|---|---|---|---|---|
| 9,793,164 | B2 | 10/2017 | Machkaoutsan et al. | |
| 9,812,351 | B1 * | 11/2017 | Licausi | H10W 20/089 |
| 10,636,703 | B2 * | 4/2020 | Jeong | H10W 20/056 |
| 10,636,739 | B2 | 4/2020 | Beyne et al. | |
| 11,075,281 | B2 | 7/2021 | Bao et al. | |
| 11,437,283 | B2 | 9/2022 | Lilak et al. | |
| 12,417,963 | B2 | 9/2025 | Lanzillo et al. | |
| 2018/0130708 | A1 * | 5/2018 | Mohanty | H10W 20/069 |
| 2022/0130760 | A1 | 4/2022 | Wu et al. | |
| 2022/0238388 | A1 | 7/2022 | Hiblot et al. | |
| 2022/0399334 | A1 | 12/2022 | Guler et al. | |
| 2022/0399335 | A1 | 12/2022 | Guler et al. | |
| 2023/0064183 | A1 | 3/2023 | Parikh et al. | |
| 2023/0132353 | A1 | 4/2023 | Xie et al. | |

* cited by examiner

*Primary Examiner* — Alexander G Ghyka
(74) *Attorney, Agent, or Firm* — Harrity & Harrity, LLP

(57) ABSTRACT

A semiconductor structure includes an interconnect wiring level having metal lines. An insulating cut shape is disposed through a run length of one of the metal lines wherein the insulating cut shape divides the one of the metal lines into electrically isolated nets.

20 Claims, 9 Drawing Sheets

100

CUT SHAPES FOR BACKSIDE METALS

BACKGROUND

The present invention generally relates to semiconductor devices and processing methods, and more particularly to semiconductor devices having a power rail cut to provide multiple signal/power connections in chip circuits.

Integrated circuit devices are constructed by forming diffusion regions in a substrate and then building up wiring connections from the substrate through to a back end of line (BEOL) structure. Such devices present a diffusion region (e.g., source/drain region) on one side of the device formed in the substrate, and a contact is dropped down to connect with the diffusion region. Metal lines connect to the contacts and are themselves connected to by other contacts and metal lines to form a metal structure in accordance with a chip design. This region of a device is referred to as an active prime region. Electrical access to the active prime region can include the use of backside power rails, signal lines and backside power distribution rail networks (BSPDN) which supply power to the device.

SUMMARY

In accordance with an embodiment of the present invention, a semiconductor structure includes an interconnect wiring level having metal lines. An insulating cut shape is disposed through a run length of at least one of the metal lines wherein the insulating cut shape divides the at least one of the metal lines into electrically isolated nets.

In accordance with another embodiment of the present invention, a method for fabricating a semiconductor structure includes forming a metal line in a dielectric layer of a metallization layer; etching trenches through the metal line along a run length of the metal line; depositing an insulating material in the trenches; and planarizing the insulating material to a surface of the dielectric layer and the metal line to form a cut shape that divides the metal line into electrically isolated nets.

In accordance with another embodiment of the present invention, a method for fabricating a semiconductor structure includes forming an insulating material on a dielectric layer; etching the insulating material to form at least one cut shape that extends along a metal line run length; depositing a conductive material over the at least one cut shape; and recessing the conductive material to expose the at least one cut shape to form electrically isolated nets on opposing sides of the at least one cut shape.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
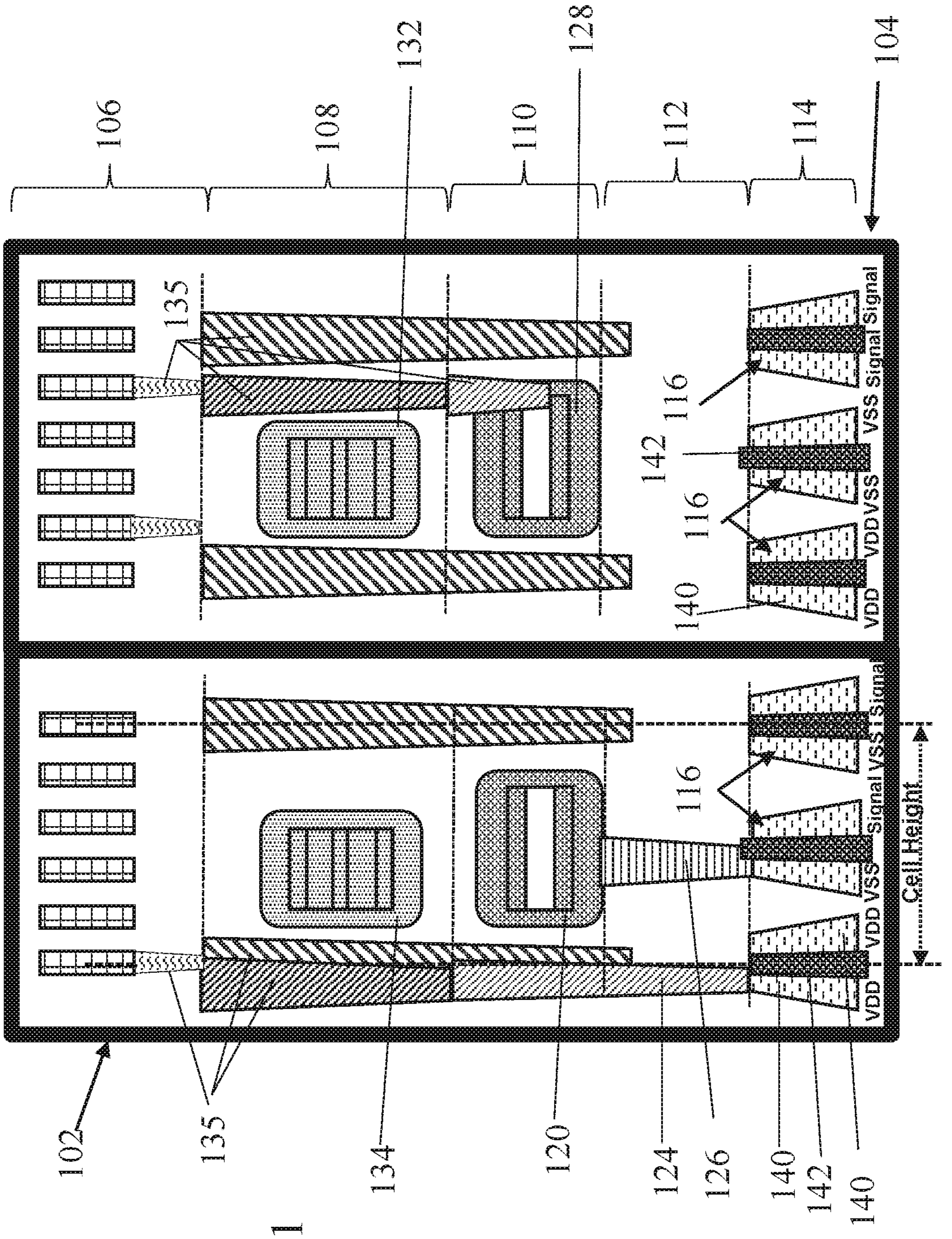
FIG. 1 shows a cross-sectional view of a source cell and a drain cell for a stacked field effect transistor device having isolated nets formed using cut shapes, in accordance with an embodiment of the present invention.

In accordance with embodiments of the present invention, devices and methods are described which include semiconductor devices having electrical paths added by cutting metal lines with a dielectric cut shape. In useful embodiments, the cut shapes or dividers are cut through the metal lines to provide electrical isolation between the two divided portions. The cut shapes are implemented longitudinally along a length of the metal line. This is especially useful in chip designs where a cell size does not permit patterning and forming a completely independent metal line.

In one embodiment, a chip can include a small cell size that does not permit multiple metal lines within the allotted space of the cell. This scenario occurs, e.g., in backside power and signal line routing. Further, capacitance coupling concerns places restrictions on distances between metal lines. In device architectures that include, e.g., stacked devices or multiple levels of devices, having the ability to include a separate supply voltage line without giving up space and without unduly introducing parasitic capacitance is particularly useful.

In some embodiments, the metal lines divided by cut shapes need not be centered along the metal line. In this way, different sized lines can be produced by a single cut line. The cut shape can be longitudinally straight, can include a wriggling pattern, or can include a repeating pattern along the longitudinal direction of the cut shape. Non-linear features along the cut shape can assist in reducing capacitive coupling between the portion of the metal line. In other embodiments, the cut shape can extend through and beyond the metal line that the cut shape is dividing. The portion of the cut shape that extends beyond the metal line can be used to assist in aligning a next metal feature that connects to the metal line.

For semiconductor device layouts, cell architecture is defined based on a cell height which is determined on the basis of a number of tracks and pitch of metal lines relative to devices (e.g., transistor widths). Cells are abutted together to implement a given design. Cells with similar height are aligned with each other to attain this similarity among the cells and avoid alignment issues. The height of a cell can be determined by considering a number of tracks needed for a power rail, a ground rail, input/output (I/O pins) and routing. The cell height puts restrictions on the size and pitch of possible metal lines. For example, going from a single line per cell to a double line per cell is often difficult due to very stringent design rules that make providing a second line within a same cell height nearly impossible. This is due in part to uneven or irregular widths which could occur due to the small line widths. In addition, spaces between lines would be too small (e.g., not enough space (resulting in crosstalk) or dielectric material between the lines (resulting in shorts)).

In accordance with the present embodiments, a semiconductor structure is provided with a level of interconnect wiring having one or more insulating cut shapes formed along a run length of a wiring level, dividing it into two or more electrically isolated networks (nets). The level of the interconnect could be formed on a frontside, a backside or both in the semiconductor structure. The cut shapes can be formed off-center from a middle of the line being cut. The cut shapes can include an extended portion to provide self-alignment for vias landing on that line. The cut material can include a single insulator layer or multiple layers including at least one ferroelectric to increase decoupling capacitance.

In useful embodiments, the cut shapes enable double or more of the metal wire resources for a given patterned pitch, e.g., at level of interconnect wiring, backside metal 1 (BM1). Cut shape width can be tuned for reliability/performance. For example, a wider cut shape can provide better reliability since the risk of shorting between positive supply voltage (VDD) and negative (or ground) supply voltage (VSS) is reduced, and a narrower cut shape can provide more decoupling capacitance since VDD and VSS nets would be closer to one another.

In one example use case, cut shapes can be employed to create power and ground supply (VDD and VSS supply, respectively) on a backside of a chip from a single wire. In another example, a wire can be cut and one segment could be used to carry a first VDD ("VDD1") while the second segment could be used to carry a second VDD ("VDD2"), i.e., two positive supply voltages. The use of multiple voltages is helpful in power gating applications, wherein power can be turned on/off over a large section of a chip design. Cut shapes in accordance with embodiments of the present invention also provide direct backside contact connections within a cell and backside signal route connections within a cell.

Narrow cut shapes (~10 nm), to put in between, e.g., VDD/VSS nets on a same wire for decoupling capacitance purposes, can be limited as being dependent on patterning process dimensions. If backside patterning employs, e.g., extreme ultraviolet lithography (EUV) then cut shapes down to ~10 nm in width can be formed. If instead, less expensive immersion lithography is employed, a minimum cut size will be larger (e.g., about 20-30 nm). These dimensions are expected to be further reduced over time as further improvements occur in the patterning technology which can further provide the ability for reduced-dimensioned cut shapes.

Embodiments of the present invention can be employed in any type of semiconductor device or chip. For example, the present embodiments can include input/output (IO) circuits, high performance computing (HPC) circuits, clock buffers, processors, memory devices or any other integrated circuit chip or combinations thereof. Adding additional conductive paths to a device in accordance with embodiments of the present invention can be integrated into any fabrication process with minimal or no impact on expense or processing time.

Referring now to the drawings in which like-numerals represent the same or similar elements and initially to FIG. 1, a stacked field effect transistor (FET) architecture 100 is shown in accordance with one illustrative embodiment. The architecture 100 can include, e.g., a 5T 80 nm cell height. The architecture 100 includes a cell 102 for epitaxial regions associated with a top field effect transistor (FET) source region 134 and a bottom FET source region 120. A cell 104 includes epitaxial regions associated with a top FET drain region 132 and a bottom FET drain region 128. The cells 102 and 104 include a front contact region 106, a top device region 108, a bottom device region 110 and a backside contact region 112. All of regions 106, 108, 110 and 112 include contacts 135 and metal lines that connect to components therein.

A bottom metal layer 114 includes backside power and signal distribution networks (nets) 116 with wires that can deliver power to a backside redistribution layer (RDL) (not shown). A RDL is a layer of wiring metal interconnects that redistribute signal access to different parts of the chip. A power RDL wire can connect to back end of line (BEOL) metallizations. In one embodiment, vias 124, 126 to buried power rail (VBPR) can connect a backside power delivery network (BSPDN) that can be used for power distribution or electrical signal transmission. Buried power rails (BPR) of the BSPDN are connected to power wires through buried vias, and these power wires are connected to the back end of the line BEOL wires.

For this architecture, three nets 116 (e.g., VDD, VSS, signal) would normally be employed; however, to improve areal density and device count, additional nets are desirable. In accordance with an embodiment, nets 116 can be subdivided into net portions 140 by employing cut shapes 142 to enable additional nets or circuits. Instead of only one net per cell, two or more nets per cell 102, 104 can be provided. In useful embodiments, VDD, VSS, and signal nets 116 can be subdivided using cut shapes 142. The subdivided nets or net portions 140 can include any net type. In other words, VDD net and a VSS net can be separated by a cut shape 142, a signal net and a VSS net can be separated by a cut shape 142, VDD net and a signal net can be separated by a cut shape 142, etc.

Additional nets can serve a number of useful purposes. For example, another net at or near a cell boundary for backside signal routing might provide less crosstalk. Another net in a middle of the cell (e.g., VSS connection to contact 126) can provide greater access to powered components. A net at or near the cell boundary can provide, e.g., VDD to a top source region 134.

Cut shapes 142 can be employed in any metal layer on a frontside or backside of a device. For ease of description, the present embodiments will be described with reference to a first backside metal line (BM1) in the context of dividing buried supply power lines (e.g., VDD and VSS) and buried signal lines (signal).

Figure 2:
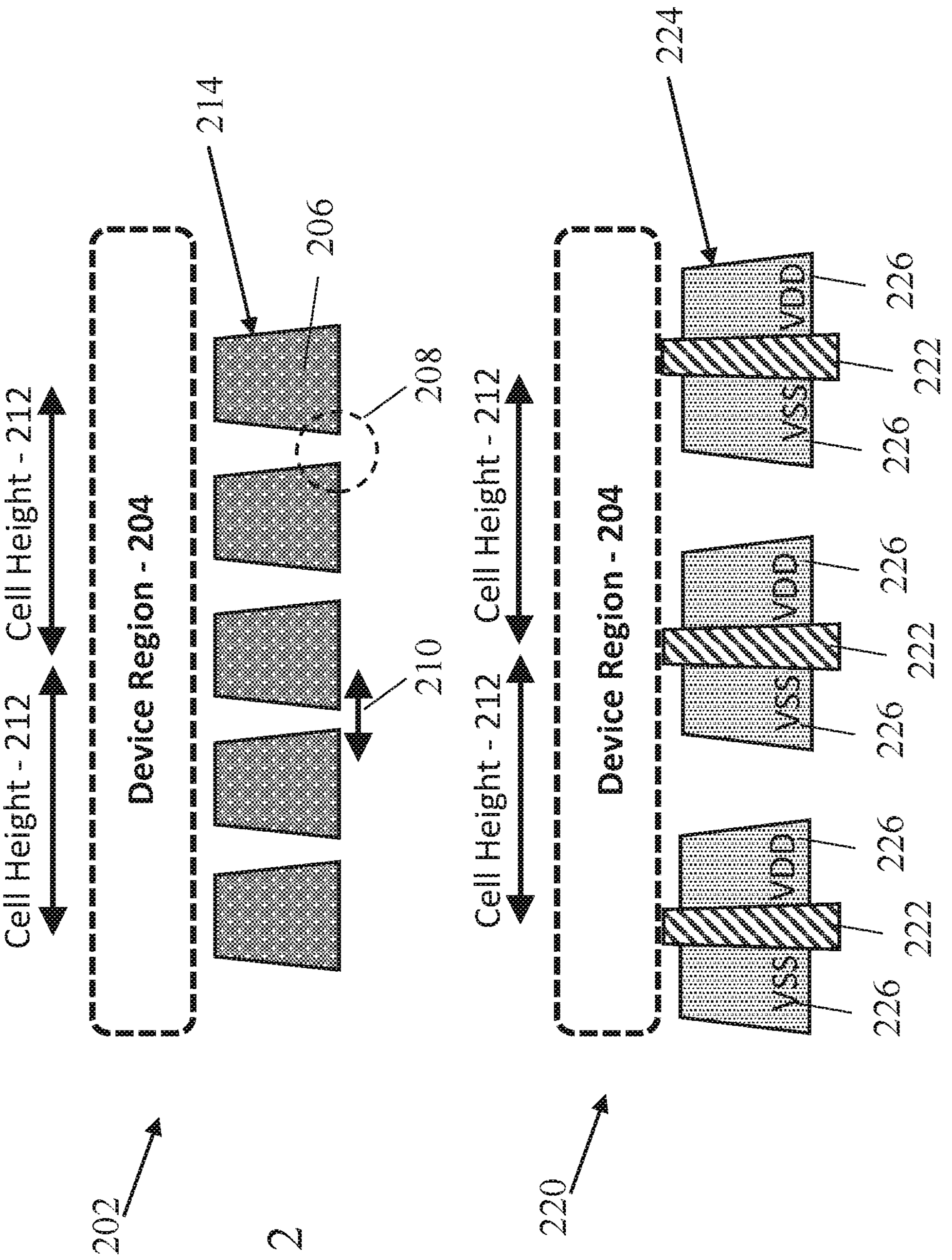
FIG. 2 shows a schematic cross-sectional view comparing a cell height with doubled lines with a two line cell with cut shapes, in accordance with an embodiment of the present invention.

Referring to FIG. 2, an illustrative comparison between a high density metal line structure 202 and a structure 220 having cut shapes 222 is shown. The high density metal line structure 202 is illustratively depicted relative to a device region 204. The device region 204 includes a substrate, transistors contacts, etc. Metal lines 206 for nets 214 are illustratively provided for a BM1 layer. As can be seen, simply doubling the number of metal lines 206 for each cell height 212 results in metal lines 206 that are too close to each other. Regions 208 provide an increased probability for shorting adjacent metal lines 206. In addition, the lack of space 210 between the metal lines 206 permits an increase in capacitive coupling between metal lines 206. In one example, for an 80 nm cell height, if two metal lines 206 (e.g., nets for VDD and VSS) where included per cell height, where the metal lines 206 are 30-40 nm in width, a needed 10 nm spacing between nets would not be possible within the 80 nm cell height, even if, e.g., a litho-etch-litho-etch (LELE) technique is employed. LELE is a form of double patterning where two separate lithography and etch steps are performed to define a single layer, thereby doubling the pattern density.

In accordance with embodiments of the present invention, a number of metal lines 224 is doubled by employing a cut shape 222 to divide the larger metals lines 224 resulting in two metal lines 226 per cell height 212. Metal lines 226 can be employed for a positive supply voltage (VDD) net and a negative or ground supply voltage (VSS) net in a same cell (e.g., within a same cell height 212) with appropriate distances maintained. By employing the cut shapes 222 metal line density can be increased without sacrificing reliability.

Figure 3:
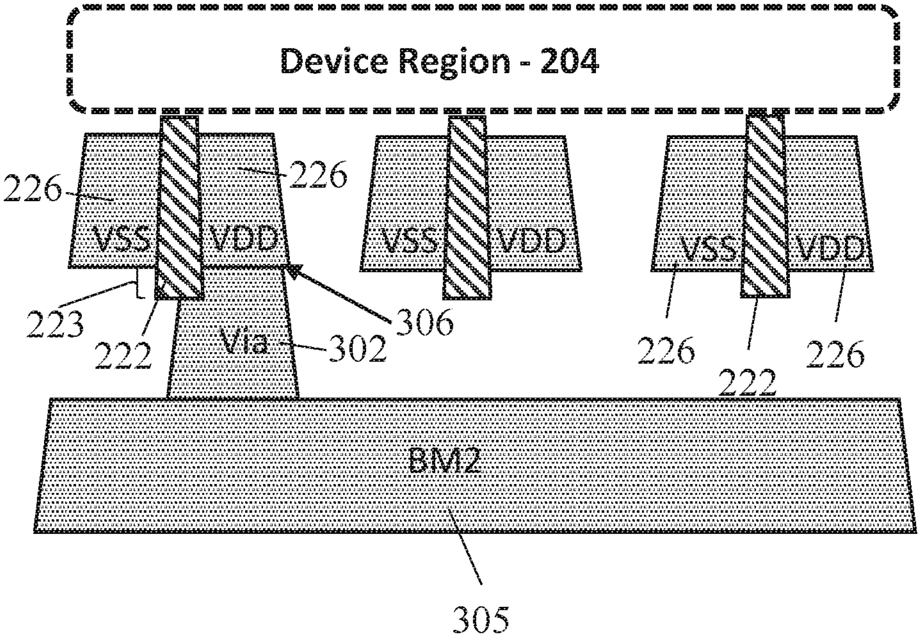
FIG. 3 shows a schematic cross-sectional view showing a via and second metal layer added to a first metal layer having a cut shape with an extended portion to provide self-alignment and overlay margin, in accordance with an embodiment of the present invention.

Referring to FIG. 3, the cut shape 222 that divides the larger metals lines 224 into the metal lines 226 can be employed to provide self-alignment or overlay margin for vias 302 landing on the BM1 layer from a backside metal layer 2 (BM2) 305 and connecting with metal line 226 at interface 306. Here, the via 302 is formed on the metal line 226 at interface 306, which includes VDD, and the cut shape 222. In this way, the via 302 is kept from connecting to the metal line 226, which includes VSS.

In one embodiment, the cut shape 222 is formed with an extended portion 223 that extends beyond a surface of the metal line 226. This extended portion 223 increases the processing margin by helping to properly land the via 302 on the metal line 226. When etching the hole for the via 302, there is less likelihood that the via hole will connect to the other metal line 226 (VSS, in this case) which is not intended to be connected by via 302. The extended portion 223 forms a “fence” to ensure proper connections are made. The extended portion 223 gives some topography to promote self-alignment and provide overly margin to via 302 landing metal line 226.

Figure 4:
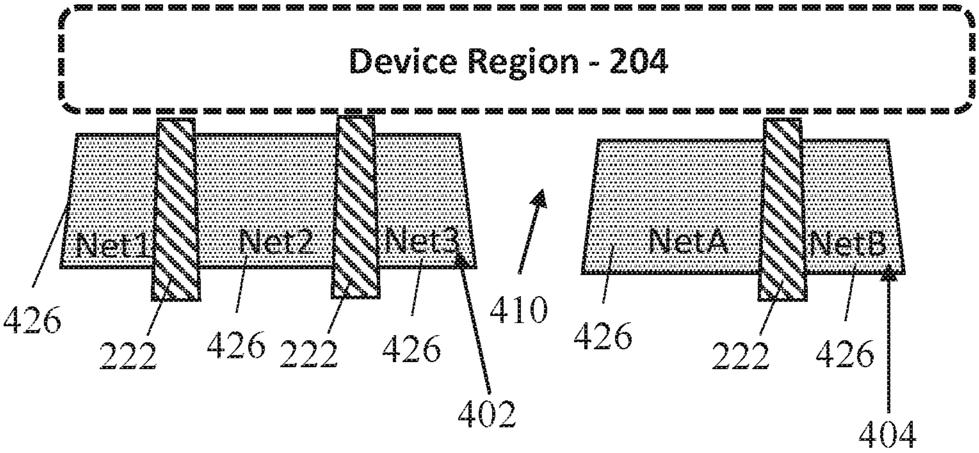
FIG. 4 shows a schematic cross-sectional view showing metal lines cut into multiple nets by cut shapes, in accordance with an embodiment of the present invention.

Referring to FIG. 4, in one embodiment, large metal lines 402, 404 (length into the page) can be formed. Multiple cuts can be made per patterned line. The metal lines 402 and 404 can be divided into nets 426. For example, two cut shapes 222 divide metal lines 402 into three nets: Net1, Net2 and Net3. One cut shape 222 divides metal lines 404 into two nets: NetA and NetB. Note that the cut shapes 222 do not have to be centered on the metal lines 402 and/or 404. In other words, the cut shapes can be off-center on the metal line that is divided. Asymmetry between portions of the metal line can exist. This can provide nets with different effective line widths, as needed. Likewise, for wider metal lines, there can be multiple cuts per line to divide the line into multiple lines/nets. These cuts do not have to be centered on the line to produce two or more nets with different effective line widths.

Figure 5:
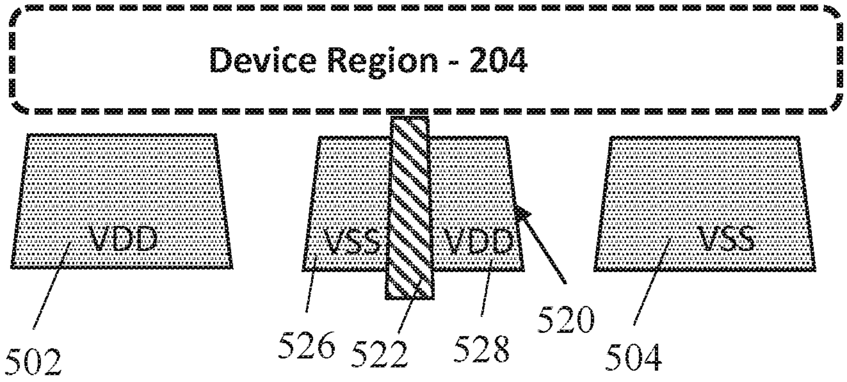
FIG. 5 shows a schematic cross-sectional view showing a selectively applied cut shape, in accordance with an embodiment of the present invention.

Referring to FIG. 5, cut shapes 522 can be selectively applied. There can be metal lines 502 and 504 without cut shapes, and there can be metal lines 520 divided by a cut shape 522 in a same metal layer. The cut shape 522 divides the metal line 520 into two to provide metal lines 526 and 528 at the same level. The metal lines 526 and 528 can, e.g., provide power rails for VDD and VSS, respectively.

Figure 6:
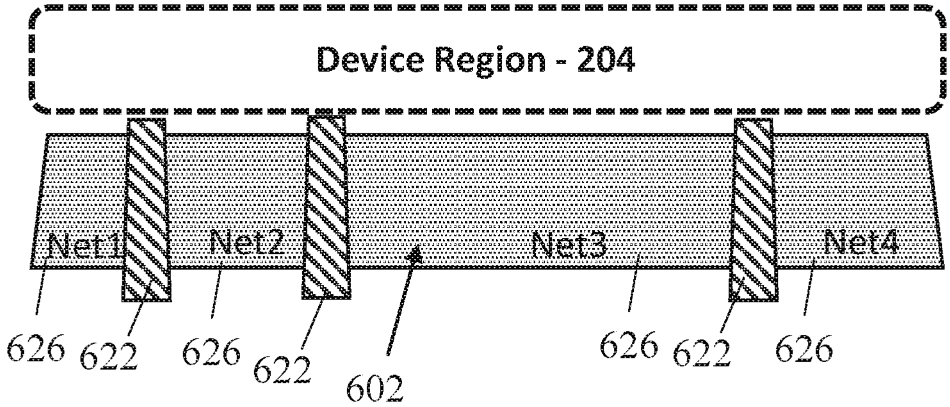
FIG. 6 shows a schematic cross-sectional view showing a wide metal line or plate divided by cut shapes, in accordance with an embodiment of the present invention.

Referring to FIG. 6, in one embodiment, a metal sheet 602 can be blanket deposited using a metal deposition process without any spaces. The metal sheet 602 can be patterned to open up cuts followed by cut shape formation. Cut shapes 622 divide the metal sheet 602 into four nets 626: Net1, Net2, Net3 and Net4. Note that the cut shapes 622 create nets 626 with different width dimensions.

Figure 7:
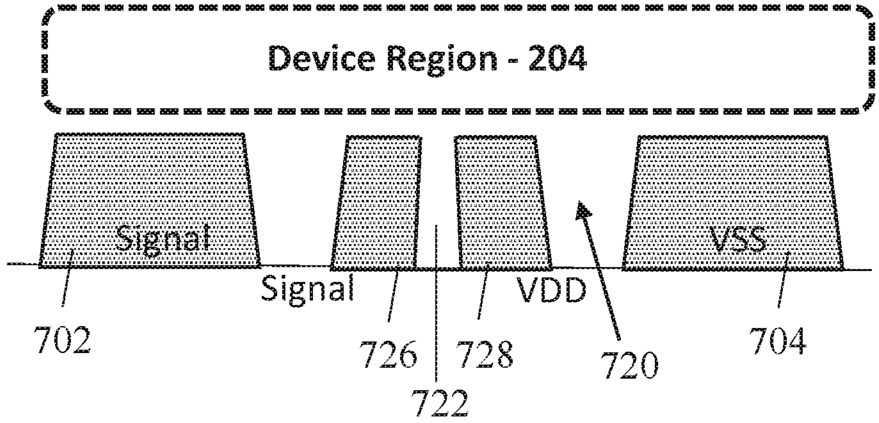
FIG. 7 shows a schematic cross-sectional view with a cut shape that employs a same material as a dielectric layer for encapsulating metal lines, in accordance with an embodiment of the present invention.

Referring to FIG. 7, in one embodiment, etching of a cut shape trench can be performed by a patterning method and etch. Instead of filling the cut shape trench with a different material, the dielectric material employed to encapsulate the other metal lines/nets 702, 704 in the metal layer can be employed to form a cut shape 722 that divides metal lines/nets 726 and 728. For example, an interlevel dielectric layer 720 can be formed and patterned to form trenches for the deposition of metal lines 702, 704 and metal lines 726, 728 prior to their division with the cut shape 722. Next, a planarization step is performed to confine the metal fill of the metal lines 702, 704, 726 and 728 to the trenches and level off the interlevel dielectric layer 720. Next, a hard mask is applied to pattern the cut shape trench, followed by deposition of a same material as the interlevel dielectric layer 720. The interlevel dielectric layer 720 can include, e.g., a low-dielectric constant material. In useful embodiments, the interlevel dielectric layer 720 can include any suitable material, e.g., silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 720 can be deposited by any suitable deposition method(s).

Figure 8:
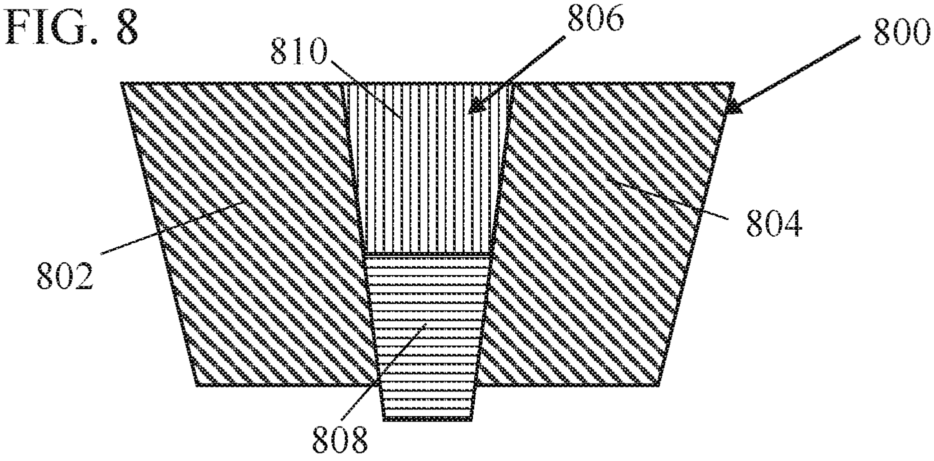
FIG. 8 shows a cross-sectional view with a cut shape having multiple layers/materials, in accordance with an embodiment of the present invention.

Referring to FIG. 8, a cross-sectional view of a metal line 800 having a compound cut shape 806 formed therein is illustratively shown in accordance with an embodiment of the present invention. The cut shape 806 splits the metal line 800 into metal lines 802 and 804. As with any embodiment described herein, the metal lines 802 and 804 created by the cut shape 806 can include supply voltage lines, signal lines, ground lines, or other type of conductive line, e.g., the metal lines 802 and 804 can both be VDD; both be VSS; both be signal; one VDD, one VSS; one signal, one VDD; and so on in any combination. The cut shape 806 can include multiple different materials to form a compound cut shape 806. In one illustrative example, the cut shape 806 includes two materials 808 and 810. Material 808 and 810 can include dielectric material having different compositions and/or properties. For example, the compound cut shape 806 can include a wedge-shape, a high-k dielectric can be employed as material 808 in a narrower portion of the compound cut shape 806 and a low-k dielectric as material 810 in a thicker portion.

In other embodiments, multiple layers can be employed including at least one ferroelectric material to increase decoupling capacitance between metal lines 802 and 804. Ferroelectric materials show a dependence on an applied electric field and can provide capacitive decoupling between metal lines 802 and 804. One or more of materials 808 and 810 can include, e.g., $HfO_2$, AlScN, or $BaTiO_3$ (BTO), etc.

While FIG. 8 shows two materials 808, 810, additional materials can be employed. For example, three layers may be used for cut shape 806 or a liner or liners may be applied before depositing materials 808 and 810.

Figure 9:
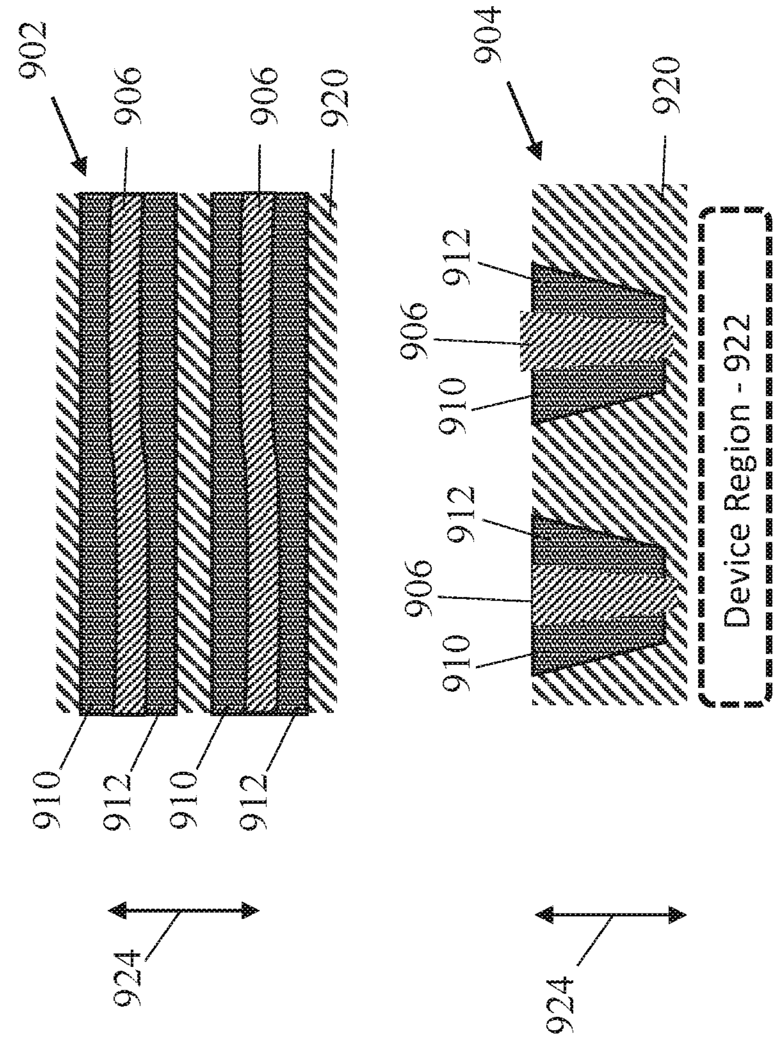
FIG. 9 shows a cross-sectional view with a cut shape having perturbations to reduce crosstalk, in accordance with an embodiment of the present invention.

Referring to FIG. 9, in one embodiment, a cut shape 906 can have perturbations or "wiggling" in directions 924 and 926. The perturbations can include periodic fluctuation in the dimensions of the cut shape 906 to further increase surface area and therefore provide capacitive decoupling between metal lines 910 and 912. Perturbations of cut shape 906 are shown in two views, a top view 902 and a cross-sectional view 904. The cross-sectional view 904 provides a device region 922 for reference.

The perturbations of the cut shape 906 can be included more easily with wider metal lines. The perturbations can be formed by tweaking features on etch masks, lithography images or exploiting settings/processing parameters. In some embodiments, the features of the perturbations may not be smooth but instead include a periodic pattern of larger and smaller width sections of the cut shape line.

The perturbations of the cut shape 906 can be formed during a damascene etching (as described with reference to FIG. 10) of a metal lines to form nets 910 and 912. In other embodiments, the perturbations of the cut shape 906 can be formed by depositing dielectric material (subtractive cut method as described with reference to FIG. 11) followed by the addition of a conductive material.

Figure 10:
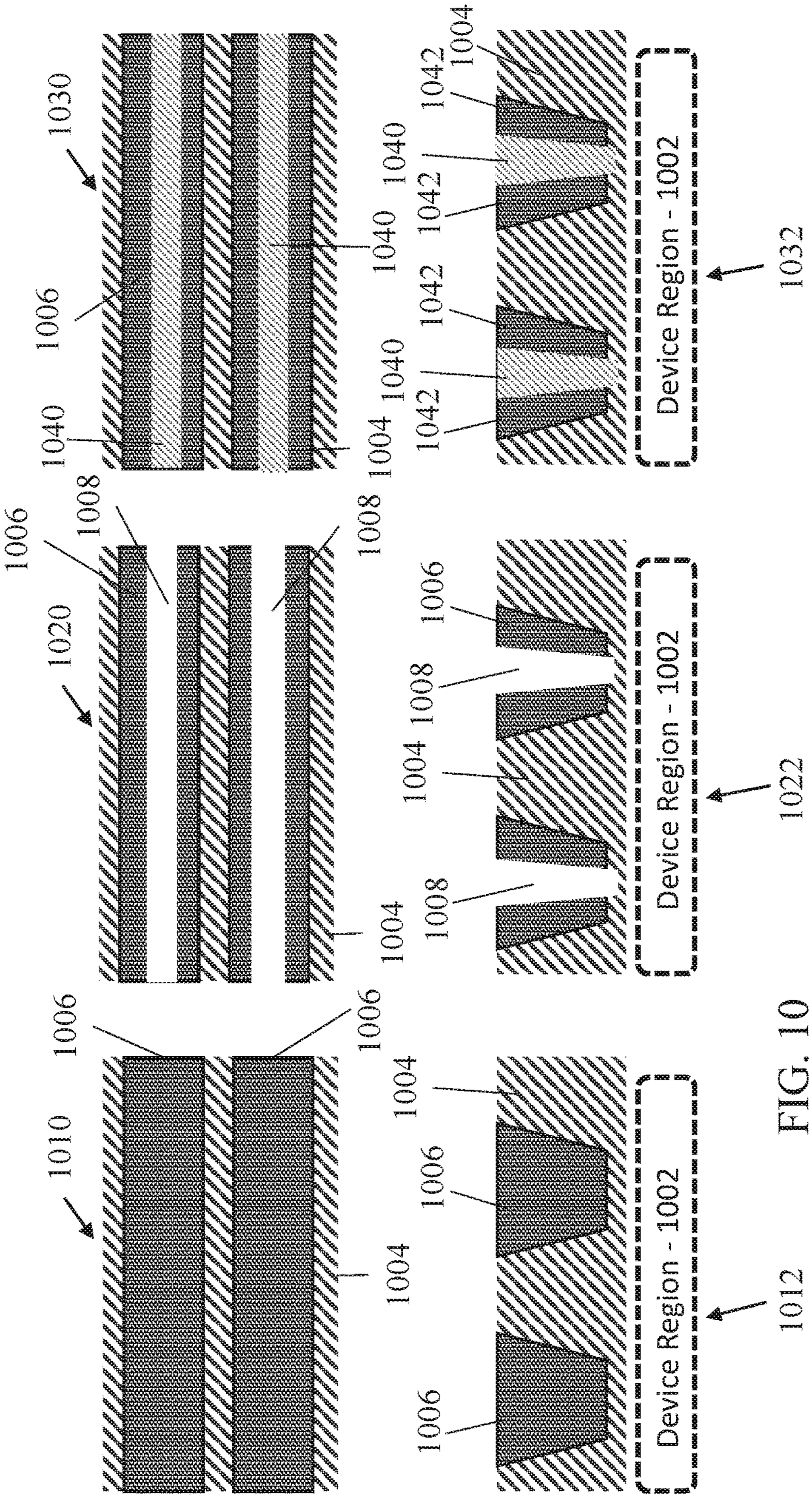
FIG. 10 shows a method for forming cut shapes using a damascene approach, in accordance with an embodiment of the present invention.

Referring to FIG. 10, a process flow for forming cut shapes 1040 by a damascene approach is shown in accordance with embodiments of the present invention. A top view 1010 and a cross-sectional view 1012 show trenches are formed in a dielectric layer 1004 followed by deposition of conductive material and planarization, e.g., by chemical mechanical polishing (CMP) to form metal lines 1006. A device region 1002 is depicted for reference. The dielectric layer 1004 can be formed at any stage of a semiconductor fabrication. In one embodiment, dielectric layer 1004 includes an interlevel dielectric layer formed at a first backside metal layer (BM1).

The dielectric layer 1004 can include, e.g., silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). The dielectric layer 1004 can be deposited by any suitable deposition method(s). The metal lines 1006 can include materials, such as, e.g., Cu, Ru, Mo, Rh, W, Ir, and alloys or combinations of these and other conductive materials.

A top view 1020 and a cross-sectional view 1022 show cut shape trenches 1008 formed in metal layers 1004. The cut shape trenches 1008 can be formed by applying a hard mask (not shown), followed by lithographic processing to produce an etch pattern. The etch process can include a reactive ion etch (RIE) process that stops on the dielectric layer 1004.

A top view 1030 and a cross-sectional view 1032 show cut shapes 1040 formed in metal layers 1004. The cut shapes 1040 can be formed by depositing a dielectric material in the cut shape trenches 1008. The dielectric material for cut shapes 1040 can include, e.g., silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). The cut shapes 1040 can also include ferroelectric materials. The material for cut shapes in then planarized, e.g., by CMP, to provide a surface for further processing.

In one embodiment, cut shapes 1040 are formed in stages to make a component cut shape. In another embodiment, the metal lines 1042 and dielectric layer 1004 are recessed to form an extended portion or fence for the cut shape 1040. The cut shapes 1040 cut the metal lines 1006 in half to form portions of metal lines or nets (1042).

Figure 11:
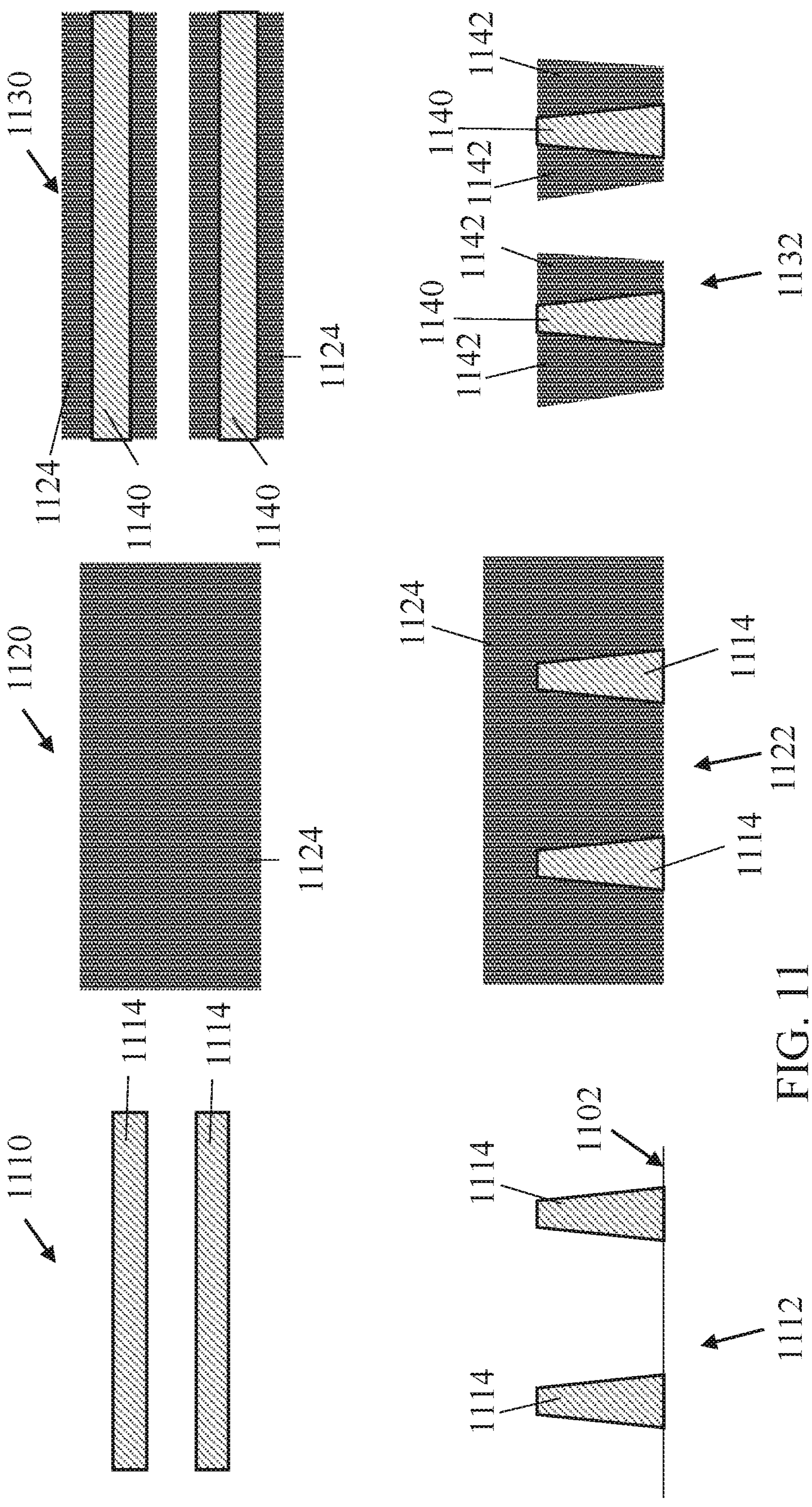
FIG. 11 shows a method for forming cut shapes using a subtractive cut approach, in accordance with an embodiment of the present invention.

Referring to FIG. 11, a process flow for forming cut shapes 1140 by a subtractive cut approach is shown in accordance with embodiments of the present invention. A top view 1110 and a cross-sectional view 1112 show cut shapes 1140 formed on a surface 1102 (e.g., a lower layer in the fabrication processing of a semiconductor device). The cut shapes 1140 are formed by a deposition process followed by patterning the cut shapes 1140 using an etch mask and etching. The cut shapes 1140 can be formed at any stage of a semiconductor fabrication. In one embodiment, the surface 1102 includes an interlevel dielectric layer formed prior to a first backside metal layer (BM1).

The cut shapes 1140 can include, e.g., silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). The cut shapes 1140 can also include ferroelectric materials. The cut shapes 1104 can be deposited by any suitable deposition method(s).

A top view 1120 and a cross-sectional view 1122 show a conductive material 1124 deposited over the cut shapes 1104. The conductive material 1124 can include materials, such as, e.g., Cu, Ru, Mo, Rh, W, Ir, and alloys or combinations of these and other conductive materials.

A top view 1130 and a cross-sectional view 1132 show cut shapes 1140 formed through the conductive material 1124 to form metal lines 1142 or nets. The conductive material 1124 is recessed to expose the cut shapes 1140. This can be performed by a wet or dry etch. The cut shapes 1140 can also be planarized, e.g., by CMP, to expose the cut shapes 1140 and to provide a surface for further processing.

In one embodiment, cut shapes 1140 are formed in multiple layers to make a component cut shape. For example, cut shapes 1140 can be formed by depositing two or more layers of different materials before etching to form the cut shapes 1140. In another embodiment, the conductive material 1124 can be recessed to form an extended portion or fence on the cut shape 1140. The cut shapes 1140 divide the conductive material 1124 in half to form metal lines 1142 or nets.

It should be understood that cut shapes 1140 in FIG. 11 have a wedge shape due to etching; however, the shape of cut shapes 1140 can be made with nearly parallel sidewalls. In this way, the cut shape 1140 can be fabricated so that the cut shape 1140 is uniform as it divides the conductive material 1124 to form metal lines 1142 with a uniform gap therebetween. The cut shape described herein can be shaped or tuned to provide improved performance. For example, cut shape width can be tuned where a wider cut shape provides better reliability (e.g., fewer shorts), while a narrower cut shape can provide more decoupling capacitance.

Wires on the backside of a chip can be used for power delivery, e.g., alternating wires that carry power (VDD) or ground (VSS). By cutting a wire using a cut shape in accordance with embodiment of the present invention, one segment of the wire is permitted to be used for VDD and the other segment to be used for VSS. If VDD and VSS short to one another, it presents a reliability risk. By making the cut shape wide, this risk can be minimized to maintain robust reliability. One other hand, capacitance between VDD and VSS (decoupling capacitance) acts to reduce power supply noise, which improves chip performance. By making a cut shape narrow, the space between VDD/VSS becomes smaller and thus the decoupling capacitance grows. The tradeoff between reliability and performance (wide versus narrow cut shapes) can be tuned depending on the application of the chip (e.g., high-performance supercomputers may need different decoupling than say, cellphones).

It should be understood that the damascene (FIG. 10) and subtractive cut (FIG. 11) methods can be employed together. In other words, some cut shapes can be fabricated by the damascene method and others by the substrative cut method in a same layer.

Figure 12:
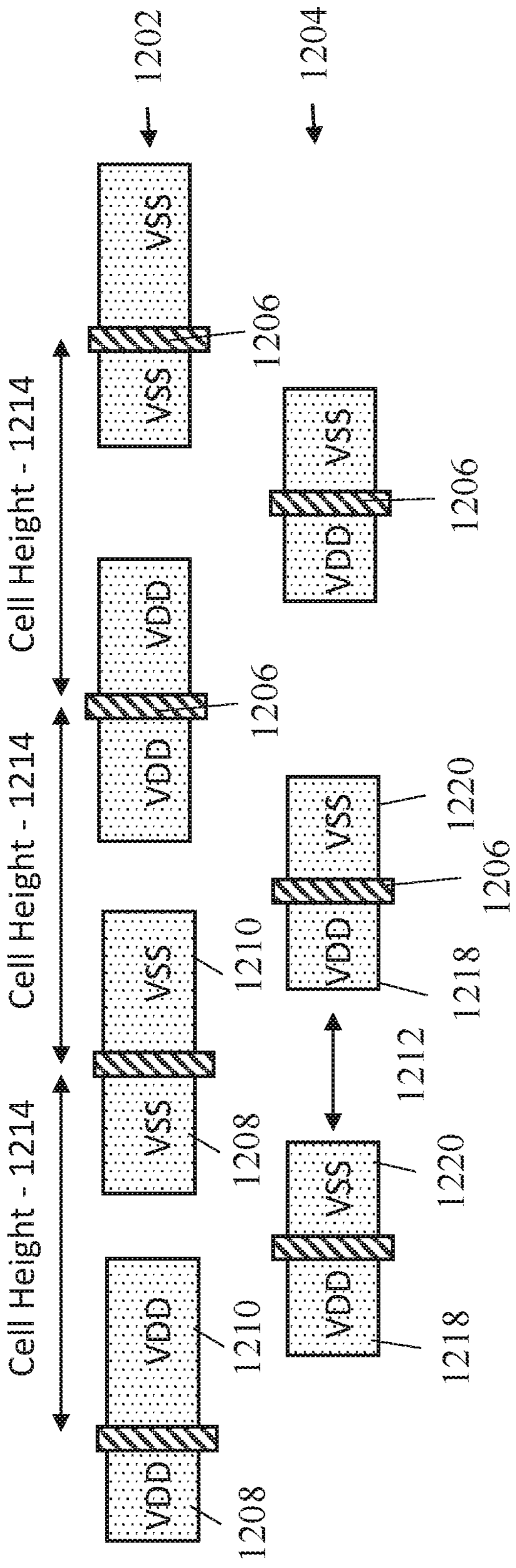
FIG. 12 shows a cross-sectional view with cut shapes employed in multiple metal layers, in accordance with an embodiment of the present invention.

Referring to FIG. 12, in some embodiments, different metal layers 1202 and 1204 whether adjacent or separated by intervening metal layers can include cut shapes 1206 to divide the metal lines into two or more isolated nets. For example, at a level of layer 1202, the cut shapes 1206 divide the metal lines into metal lines (or nets) 1208 and 1210. Similarly, at a level of layer 1204, the cut shapes 1206 divide the metal lines into metal lines (or nets) 1218 and 1220. Pitches and spacings 1212 can be determined based on cell heights 1214, as needed or desired. In addition, the type of net can be selected in accordance with a design. For example, VDD and VSS may be grouped in a same metal level or between metal levels. While all the depicted metal lines are shown having cut shapes 1206, not all metal lines need to include a cut shape.

In some embodiments a backside metal can include cut shapes that divide metal lines for power delivery. In one embodiment, one line per cell height can be used and use different sides of the cut for VDD and VSS. With adjacent VDD and VSS lines or nets, this can be good for capacitive decoupling. Different materials can be employed for cut shape in a same level depending on function. For example, a low-k dielectric can be employed for cut shapes between signal wires while high-k dielectric can be employed for cut shapes between power wires.

The embodiments described herein can include combinations of multiple features of the present invention. For example, a single cut shape can be asymmetrically aligned with the metal line it divides, can include an extended portion ("fence"), have a compound composition (multiple materials), include a wriggling effect for capacitive decoupling and any other feature of combination of features.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
an interconnect wiring level having metal lines; and
an insulating cut shape extending through a single metal line of the metal lines along a run length of the single metal line, the insulating cut shape including first and second dielectric material portions having dielectric compositions different from each other, the insulating cut shape physically separating first and second metal portions of the single metal line from each other, the first and second metal portions defining respective first and second electrically isolated nets on opposing sides of the insulating cut shape.

2. The semiconductor structure of claim 1, wherein the insulating cut shape is off-center to provide the first and second electrically isolated nets with different widths.

3. The semiconductor structure of claim 1, wherein the insulating cut shape includes an extended portion that extends beyond a surface of the single metal line to provide self-alignment and overlay margin to a via landing on one of the first and second electrically isolated nets.

4. The semiconductor structure of claim 1, wherein the insulating cut shape includes a plurality of layers.

5. The semiconductor structure of claim 4, wherein at least one of the plurality of layers includes a ferroelectric material.

6. The semiconductor structure of claim 1, further comprising one or more additional insulating cut shapes, the insulating cut shape and the one or more additional insulating cut shapes dividing the single metal line into three or more electrically isolated nets, the three or more electrically isolated nets including the first and second electrically isolated nets.

7. The semiconductor structure of claim 1, the insulating cut shape having, along the run length of the single metal line, a repeating pattern of alternating first sections having a first lateral width and second sections having a second lateral width greater than the first lateral width to reduce crosstalk between the first and second electrically isolated nets.

8. The semiconductor structure of claim 1, further comprising a second interconnect wiring level disposed at a different level than the interconnect wiring level, the second interconnect wiring level including an additional insulating cut shape disposed through a run length of a metal line of the second interconnect wiring level, the additional insulating cut shape dividing the metal line of the second interconnect wiring level into electrically isolated nets.

9. A method for fabricating a semiconductor structure, comprising:

forming, in a dielectric layer of a metallization layer, a single metal line among metal lines of an interconnect wiring level;

etching trenches through the single metal line along a run length of the single metal line;

depositing insulating material in the trenches, the insulating material including first and second dielectric materials having dielectric compositions different from each other; and planarizing the insulating material to a surface of the dielectric layer and the single metal line to form an insulating cut shape including first and second dielectric material portions formed from the first and second dielectric materials, the insulating cut shape physically separating first and second metal portions of the single metal line from each other, the first and second metal portions defining respective first and second electrically isolated nets on opposing sides of the insulating cut shape.

10. The method of claim 9, wherein the insulating cut shape is off-center to provide the first and second electrically isolated nets with different widths.

11. The method of claim 9, further comprising recessing the single metal line to form an extended portion of the insulating cut shape that extends beyond a surface of the single metal line to provide self-alignment and overlay margin to a via landing on one of the first and second electrically isolated nets.

12. The method of claim 9, wherein depositing the insulating material in the trenches includes depositing a plurality of layers for the insulating cut shape.

13. The method of claim 12, wherein at least one of the plurality of layers includes a ferroelectric material.

14. The method of claim 9, wherein etching the trenches through the single metal line includes etching one or more additional trenches that, after depositing the insulating material and planarizing the insulating material, form one or more additional insulating cut shapes, the insulating cut shape and the one or more additional insulating cut shapes dividing the single metal line into three or more electrically isolated nets, the three or more electrically isolated nets including the first and second electrically isolated nets.

15. The method of claim 9, wherein etching the trenches through the single metal line includes forming at least one trench having, along the run length of the single metal line, a repeating pattern of alternating first sections having a first lateral width and second sections having a second lateral width greater than the first lateral width to reduce crosstalk between the first and second electrically isolated nets.

16. A method for fabricating a semiconductor structure, comprising:

forming insulating material on a dielectric layer, the insulating material including first and second dielectric materials having dielectric compositions different from each other;

etching the insulating material to form at least one insulating cut shape that extends along a metal line run length and includes first and second dielectric material portions formed respectively from the first and second dielectric materials;

depositing a conductive material over the at least one insulating cut shape; and recessing the conductive material to expose the at least one insulating cut shape and form metal lines of an interconnect wiring level, the metal lines including a single metal line having first and second metal portions defining respective first and second electrically isolated nets on opposing sides of the at least one insulating cut shape.

17. The method of claim 16, wherein the first and second electrically isolated nets have different widths.

18. The method of claim 16, further comprising recessing the conductive material to form an extended portion of the at least one insulating cut shape that extends beyond a surface of the conductive material to provide self-alignment and overlay margin to a via landing on one of the first and second electrically isolated nets.

19. The method of claim 16, wherein forming the insulating material includes depositing a plurality of layers for the at least one insulating cut shape, wherein at least one of the plurality of layers includes a ferroelectric material.

20. The method of claim 16, wherein etching the insulating material includes forming the at least one insulating cut shape with, along the metal line run length, a repeating pattern of alternating first sections having a first lateral width and second sections having a second lateral width greater than the first lateral width to reduce crosstalk between the first and second electrically isolated nets.

* * * * *